(12) United States Patent
Kim et al.

(10) Patent No.: US 6,417,012 B1
(45) Date of Patent: Jul. 9, 2002

(54) METHOD OF FORMING FERROELECTRIC CAPACITOR IN SEMICONDUCTOR DEVICE

(75) Inventors: Nam-Kyeong Kim; Woo-Seok Yang; Seung-Jin Yeom, all of Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/005,605

(22) Filed: Dec. 7, 2001

(30) Foreign Application Priority Data

Dec. 8, 2000 (KR) .......................................... 2000-74482

(51) Int. Cl.[7] .............................................. H01L 21/00
(52) U.S. Cl. ........................................ 438/3; 438/240
(58) Field of Search ............................ 438/3, 240, 253, 438/254, 255, 396, 397, 398

(56) References Cited

U.S. PATENT DOCUMENTS

| | | | | |
|---|---|---|---|---|
| 6,096,597 A | * | 8/2000 | Tsu et al. ..................... | 438/240 |
| 6,245,580 B1 | * | 6/2001 | Solayappan et al. ........ | 438/240 |
| 6,251,720 B1 | * | 6/2001 | Thakur et al. ............... | 438/240 |
| 6,274,454 B1 | * | 8/2001 | Katori ........................... | 438/240 |
| 2002/0045358 A1 | * | 4/2002 | Weimer et al. ............. | 438/778 |

* cited by examiner

Primary Examiner—Tuan H. Nguyen
(74) Attorney, Agent, or Firm—Jacobson Holman, PLLC

(57) ABSTRACT

A semiconductor fabrication technique for forming a ferroelectric capacitor, in which the thermal burden is reduced by using an SBT-based ferroelectric thin film such as $Sr_xBi_yTa_2O_9$ ('SBT') or $Sr_xBi_y(Ta_iNb_j)_2O_9$ ('SBT(N)') as the dielectric medium. The method includes the following steps. A strontium-bismuth-tantalum oxide film is formed on a semiconductor substrate, with a conductive film for a lower electrode having been formed on the semiconductor substrate (first step). An $NH_3$ gas is flowed at a stabilizing step of a rapid thermal annealing so as to reduce organic materials bonded with metal elements of the strontium-bismuth-tantalum oxide film (second step). An oxide gas is flowed at a temperature of 450~650° C. at an annealing step of the rapid thermal annealing so as to induce a perovskite nuclear formation in the strontium-bismuth-tantalum oxide film (third step). A furnace annealing is then carried out so as to induce a grain growth in the strontium-bismuth-tantalum oxide film (fourth step).

6 Claims, 3 Drawing Sheets

METHOD OF FORMING FERROELECTRIC CAPACITOR IN SEMICONDUCTOR DEVICE

FIELD OF THE INVENTION

The present invention relates to a semiconductor fabrication technique. Particularly, the present invention relates to a method for forming a ferroelectric capacitor, in which a ferroelectric thin film is used as the dielectric medium. More specifically, the present invention relates to a method for forming a ferroelectric capacitor, in which there is used a strontium(Sr)-bismuth(Bi)-tantalum(Ta)(SBT)-based ferroelectric thin film such as $Sr_xBi_yTa_2O_9$ (to be called 'SBT' below) or $Sr_xBi_y(Ta_tNb_j)_2O_9$ (to be called 'SBT(N)' below) as the dielectric medium.

BACKGROUND OF THE INVENTION

Ferroelectric material has a high dielectric constant, and shows a nonvolatile polarization, and therefore, it is used as a semiconductor material. That is, ferroelectric material has become a new semiconductor material for a high density Gb or more) DRAM (dynamic random access memory), and for the ferroelectric memory (FeRAM).

Depending upon the method of connection to the substrate, the ferroelectric capacitor is classified as a NPP (non-plug poly) structure or a PP (plug poly) structure. First, in the ferroelectric capacitor of the NPP structure, the junction of the MOS transistor is connected to the upper electrode through a metal wiring, so that the upper electrode can serve as a storage node and the lower electrode can serve as a cell plate.

On the other hand, in the ferroelectric capacitor of the PP structure, the junction of the MOS transistor is connected to the lower electrode through a polysilicon plug, so that the lower electrode can serve as a storage node, and the upper electrode can serve as a cell plate.

If the density of the device is considered, the ferroelectric capacitor of the PP structure is preferable to the ferroelectric capacitor of the NPP structure. However, if the PP structure is adopted, a process difficulty is encountered. That is, when forming the upper and lower electrodes and the dielectric medium, and when carrying out the post thermal process, oxygen is diffused to form a low dielectric constant silicon oxide $(SiO_2)$ on the polysilicon plug. As a result, most of the externally supplied voltage is supplied to the low dielectric constant silicon oxide, thereby forming a fatal defect.

Meanwhile, the SBT, or SBT(N), is formed by carrying out a heat treatment for realizing crystallization, so that superior electrical properties can be obtained. The crystallizing heat treatment includes a rapid thermal annealing (RTA) and a furnace annealing. The RTA is carried out under an oxygen atmosphere so as to remove a metal-containing organic material and so as to realize a nuclear formation, while the furnace annealing is carried out for the growth of grains.

Under this condition, the RTA (rapid thermal annealing) is carried out at a temperature of about 725° C., and the furnace annealing is carried out at a temperature of about 800° C. Therefore, if a certain polarization value is to be obtained, there is a problem in that a thermal budget is imposed. Increase of the thermal budget aggravates the formation of the silicon oxide in the PP structure. Consequently, the barrier metal film is degraded, thereby reducing the reliability of the device.

SUMMARY OF THE INVENTION

The present invention is intended to overcome the above described disadvantages of the conventional technique.

Therefore it is an object of the present invention to provide a method of forming a ferroelectric capacitor in a semiconductor device, in which the thermal burden can be reduced by using an SBT-based ferroelectric thin film.

In achieving the above object, the method for forming a ferroelectric capacitor in a semiconductor device according to the present invention includes the steps of forming a strontium-bismuth-tantalum oxide film on a semiconductor substrate, with a conductive film for a lower electrode having been formed on the semiconductor substrate (first step); flowing an $NH_3$ gas at a stabilizing step of a rapid thermal annealing so as to reduce organic materials bonded with metal elements of the strontium-bismuth-tantalum oxide film (second step); flowing an oxide gas at a temperature of 450~650° C. at an annealing step of the rapid thermal annealing so as to induce a perovskite nuclear formation in the strontium-bismuth-tantalum oxide film (third step); and carrying out a furnace annealing so as to induce a grain growth in the strontium-bismuth-tantalum oxide film (fourth step).

Preferably, the second step is carried out at a temperature of 300~450°C.

Preferably, the oxide gas is at least one selected from the group consisting of: $O_2$, $N_2O$, $H_2O$, $H_2O_2$ and $O_3$.

Preferably, the strontium-bismuth-tantalum oxide film is $Sr_xBi_yTa_2O_9$ or $Sr_xBi_y(Ta_tNb_j)_2O_9$.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE PREFERRED EMBODIMENTS

The preferred embodiments of the present invention will be described in detail below so that those ordinarily skilled in the art can easily carry out the present invention.

Figure 1A:
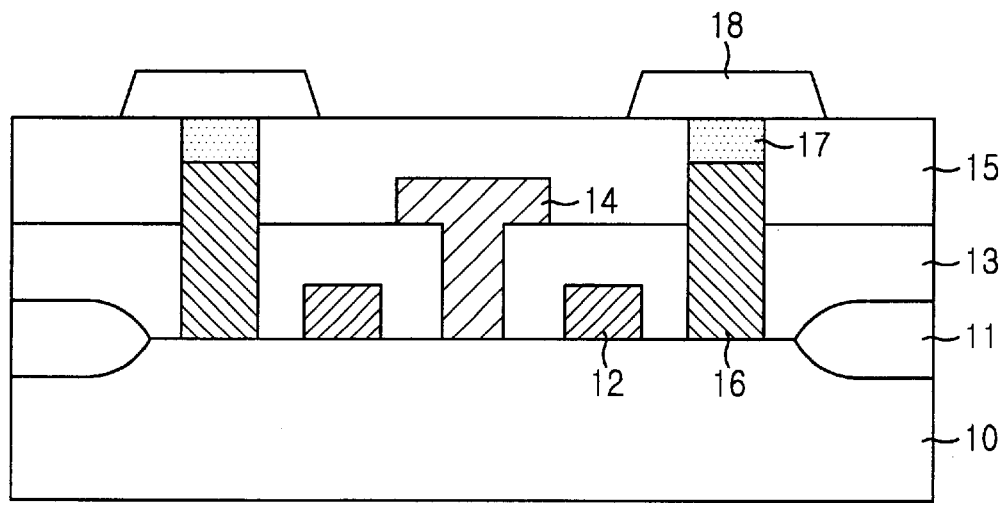
FIGS. 1a to 1c illustrate the process for forming the ferroelectric capacitor according to the present invention.
Figure 1B:
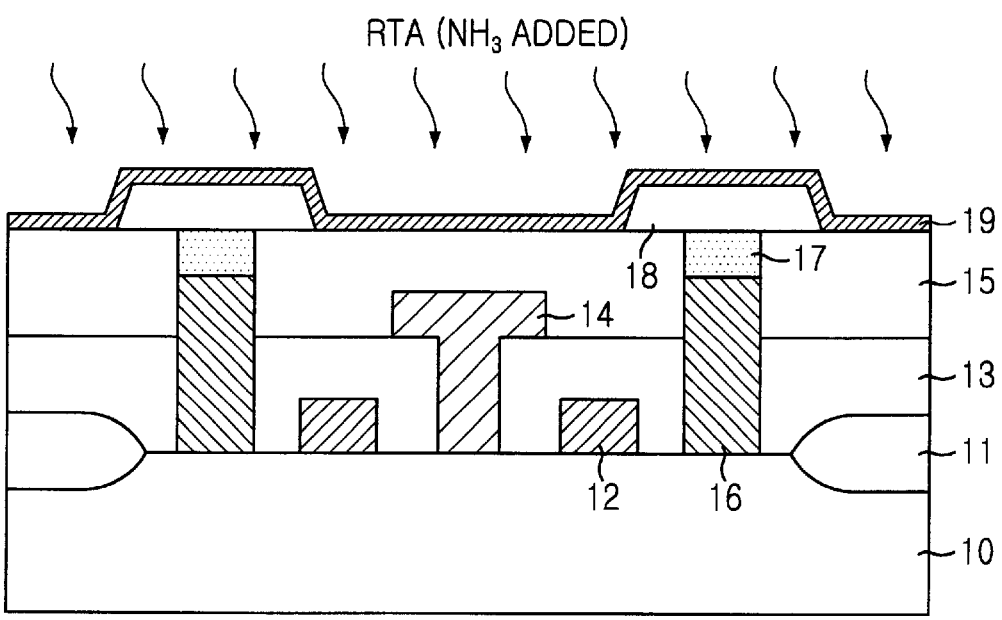
Figure 1C:
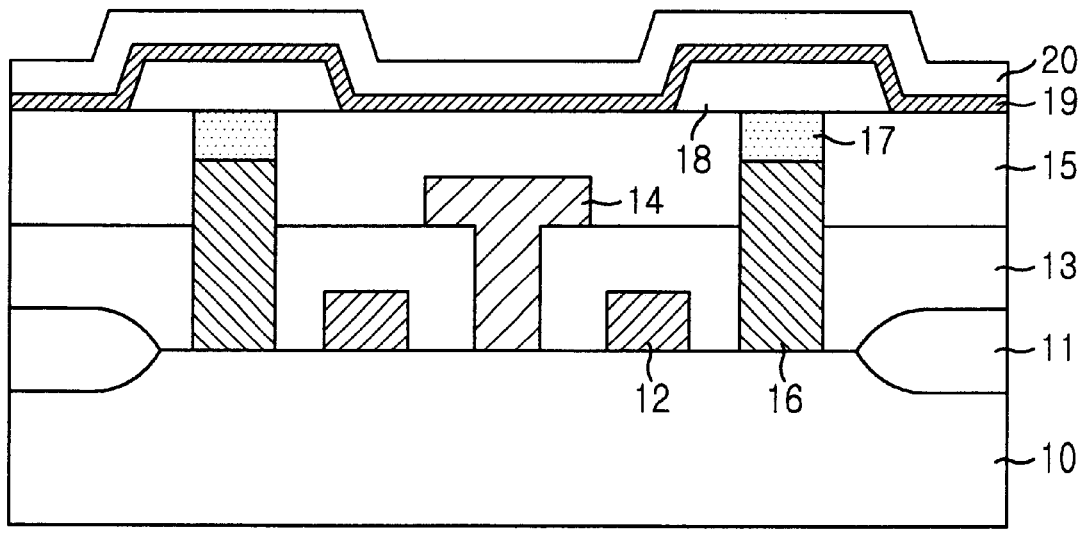

FIGS. 1a to 1c illustrate the process for forming the ferroelectric capacitor according to the present invention.

The process for forming the ferroelectric capacitor according to the present invention is carried out in the following manner. First as shown in FIG. 1a, a device isolating film 11, a word line 12 and a bit line 14 are formed on a silicon substrate 10. Then interlayer insulating films 13 and 15 that have been formed during the above step are etched to form a contact hole. Then a polysilicon plug 16 and a silicide/barrier metal layer 17 are formed to fill the contact hole, and then, a lower electrode 18 is formed.

Under this condition, the silicide is for an ohmic contact, and Ti silicide should preferably be used, while the barrier metal layer is made of Ti—Al—N, Ti—Si—N, or the like. Further, for the lower electrode 18, there is used a metal or a metal compound such as Ir, $IrO_x$, Ru, $RuO_x$, Pt, LSCO (La, Sr, Co, O), or YBCO (Y, Ba, Co, O). Thus the lower electrode 18 is deposited to a thickness of 500~3000 Å by carrying out the MOCVD, PVD or PECVD method.

Then as shown in FIG. 1b, an SBT film 19 is deposited upon the lower electrode 18, after which a rapid thermal annealing is carried out at the stabilizing step by introducing an NH$_3$ gas to remove the metal-bonded organic materials, and to induce the perovskite nuclear growth.

This procedure will be described in more detail below.

The SBT film 19 can be deposited by carrying out any one selected from among: PVD (physical vapor deposition) method, MOCVD (metal organic chemical vapor deposition) method, PE-MOCVD (plasma enhanced MOCVD) method, and LSMCD (liquid source mist chemical deposition) method. The content proportion y of Bi should be preferably 2.05~2.5, and the content proportion x of Sr should be preferably 0.7~1.0.

Meanwhile, when a spin-on method is adopted to mix the starting materials (metal powders) such as Sr, Bi and Ta, octane is used as the solvent. Further, n-butyl acetate is used as a stabilizing agent for the liquid metal powder mixture.

Figure 2:
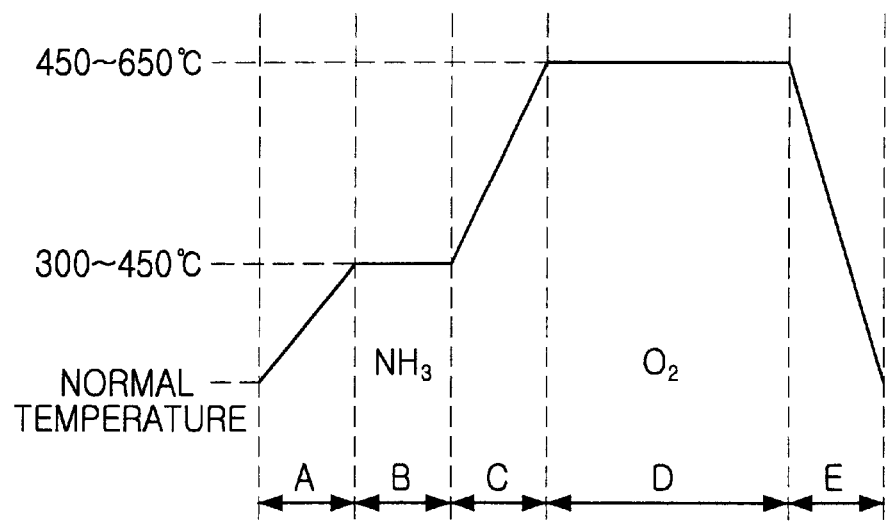
FIG. 2 is a graphical illustration showing the rapid thermal process for an SBT(N) film according to the present invention.
Figure 3:
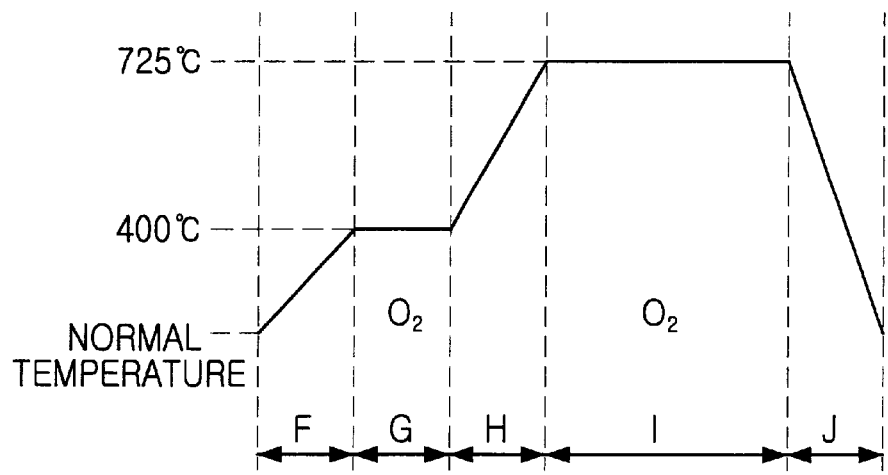
FIG. 3 is a graphical illustration showing the rapid thermal process for the conventional SBT(N) film.

Then a rapid thermal annealing is carried out. FIG. 2 is a graphical illustration showing the rapid thermal process for an SBT(N) film according to the present invention. FIG. 3 is a graphical illustration showing the rapid thermal process for the general SBT(N) film.

First, referring to FIG. 3, the conventional rapid thermal annealing includes a heating-up step (F), a stabilizing step (G), a temperature raising step (H), an annealing step (I), and a cooling step (J). At the stabilizing step (G), a temperature of about 400° C. is maintained so that the wafer can be protected from damage arising from abrupt variation of the temperature. Under this condition, the atmospheric gas is O$_2$ (or N$_2$O, H$_2$O, H$_2$O$_2$, O$_3$). The annealing step (I) is carried out at a temperature of about 725° C. under an O$_2$ atmosphere.

Meanwhile, the rapid thermal annealing according to the present invention also includes a heating-up step (A), a stabilizing step (B), a temperature raising step (C), an annealing step (D), and a cooling step (E). However, the stabilizing step B is carried out at a temperature of about 300° C. to 450° C. by flowing an NH$_3$ gas instead of O$_2$ gas, thereby reducing the metal-bonded organic materials.

Thus, the annealing step (D) is carried out after removing the metal-bonded organic materials, and therefore, the annealing temperature can be lowered from the conventional 725° C. to 450~650° C. This owes to the following fact. That is, at the conventional annealing step (I), the organic material removal and the perovskite nuclear formation proceed simultaneously, whereas, in the present invention, the organic materials are removed at the low temperature stabilizing step (B) by flowing the NH$_3$ gas, and therefore, the perovskite nuclear formation has only to be induced at the annealing step (D).

Thereafter, a furnace annealing is carried out to make the grains grow.

Then, as shown in FIG. 1c, an upper electrode 20 is deposited. For the upper electrode, there is used a metal or a metal compound such as Ir, IrOx, Ru, RuOx, Pt, LSCO (La, Sr, Co, O), or YBCO (Y, Ba, Co, O), and the deposition is carried out by applying the MOCVD, PVD, or PECVD method.

In another embodiment of the present invention, SBT(N) is used instead of SBT as the ferroelectric material. Under this condition, the content of Nb within the SBT(N) should preferably be limited to 20~30%.

In the above described process, the metal-bonded organic materials are removed in advance by flowing the NH$_3$ gas at the stabilizing step, and then, the annealing step is carried out. Accordingly, the annealing temperature can be lowered, and therefore, the thermal burden on the device can be alleviated.

In the above, the present invention was described based on the specific preferred embodiments and the attached drawings, but it should be apparent to those ordinarily skilled in the art that various changes and modifications can be added without departing from the spirit and scope of the present invention, which will be defined in the appended claims.

For example, the above description assumed that the PP structure was adopted, but the present invention can be applied also to forming the ferroelectric capacitor when the NPP structure is adopted.

According to the present invention as described above, the thermal burden can be alleviated by using the SBT(N) thin film in forming the ferroelectric capacitor, and therefore, reliability and yield can be improved.

What is claimed is:

1. A method for forming a ferroelectric capacitor in a semiconductor device, comprising the steps of:

forming a strontium-bismuth-tantalum oxide film on a semiconductor substrate, with a conductive film for a lower electrode having been formed on the semiconductor substrate (first step);

flowing an NH$_3$ gas at a stabilizing step of a rapid thermal annealing so as to reduce organic materials bonded with metal elements of the strontium-bismuth-tantalum oxide film (second step);

flowing an oxide gas at a temperature of 450~650° C. at an annealing step of the rapid thermal annealing so as to induce a perovskite nuclear formation in the strontium-bismuth-tantalum oxide film (third step); and carrying out a furnace annealing so as to induce a grain growth in the strontium-bismuth-tantalum oxide film (fourth step).

2. The method as claimed in claim 1, wherein the second step is carried out at a temperature of 300~450° C.

3. The method as claimed in claim 1, wherein the oxide gas is at least one selected from the group consisting of: O$_2$, N$_2$O, H$_2$O, H$_2$O$_2$, and O$_3$.

4. The method as claimed in claim 1, wherein the strontium-bismuth-tantalum oxide film is Sr$_x$Bi$_y$Ta$_2$O$_9$ or Sr$_x$Bi$_y$(Ta$_i$Nb$_j$)$_2$O$_9$.

5. The method as claimed in claim 2, wherein the oxide gas is at least one selected from the group consisting of: O$_2$, N$_2$O, H$_2$O, H$_2$O$_2$, and O$_3$.

6. The method as claimed in claim 2, wherein the strontium-bismuth-tantalum oxide film is Sr$_x$Bi$_y$Ta$_2$O$_9$ or Sr$_x$Bi$_y$(Ta$_i$Nb$_j$)$_2$O$_9$.

* * * * *